Figure 1:
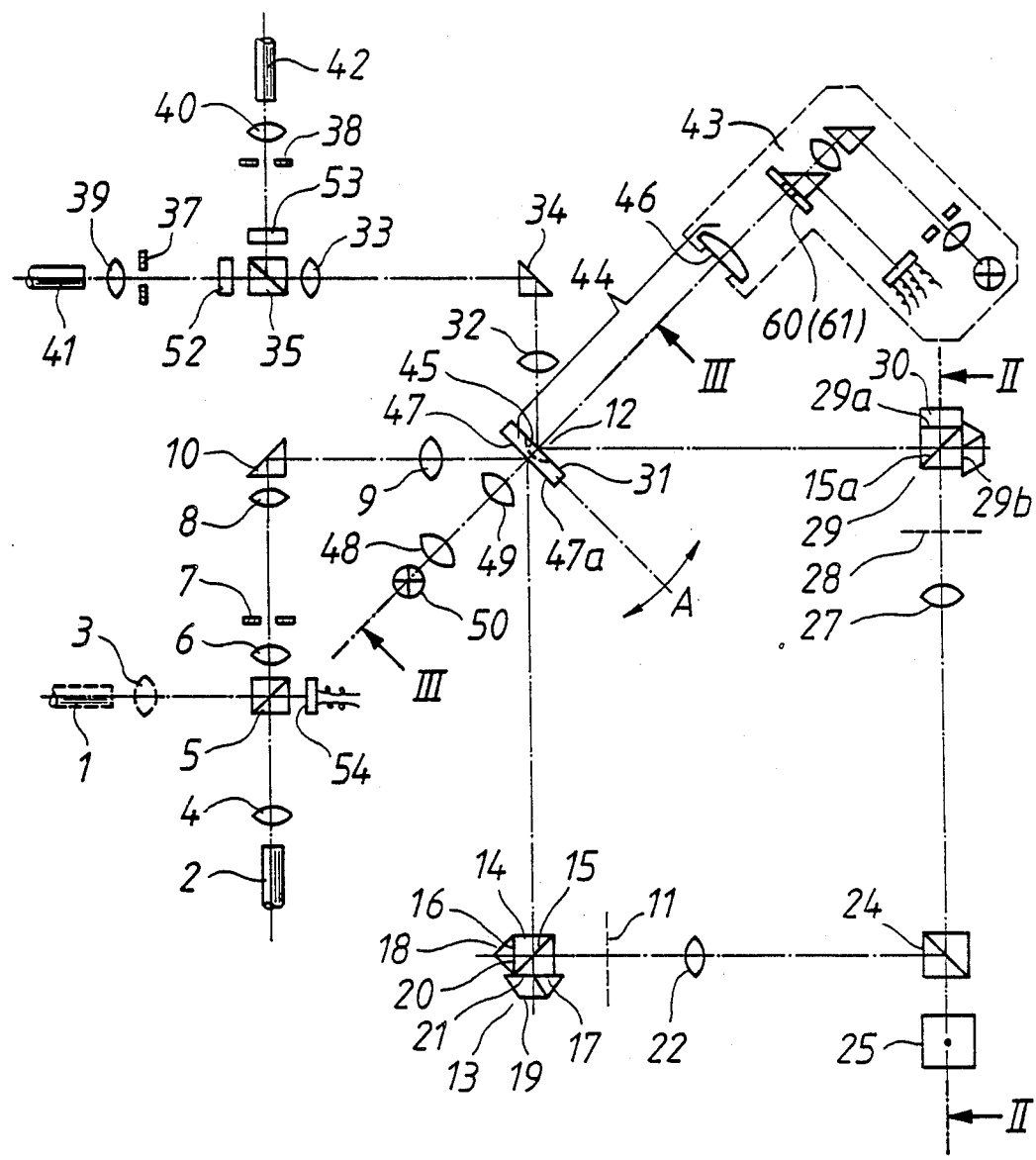

United States Patent [19]

Schuster

[11] Patent Number: 4,758,731
[45] Date of Patent: Jul. 19, 1988

[54] METHOD AND ARRANGEMENT FOR ALIGNING, EXAMINING AND/OR MEASURING TWO-DIMENSIONAL OBJECTS

[75] Inventor: Erich Schuster, Wetzlar, Fed. Rep. of Germany

[73] Assignee: Ernst Leitz Wetzlar GmbH, Wetzlar, Fed. Rep. of Germany

[21] Appl. No.: 22,638
[22] PCT Filed: Apr. 3, 1986
[86] PCT No.: PCT/DE86/00146
§ 371 Date: Jan. 12, 1987
§ 102(e) Date: Jan. 12, 1987
[87] PCT Pub. No.: WO86/06852
PCT Pub. Date: Nov. 20, 1986

[30] Foreign Application Priority Data

May 11, 1985 [DE] Fed. Rep. of Germany ....... 3517070

[51] Int. Cl.⁴ .......................... G03B 41/00; G03F 9/00
[52] U.S. Cl. ..................... 250/560; 250/235; 250/561; 350/6.91
[58] Field of Search ............... 250/235, 236, 560, 563, 250/571, 561; 350/6.1, 6.5, 6.91; 356/253, 254, 255, 400, 429, 431

[56] References Cited

U.S. PATENT DOCUMENTS 3,865,483 2/1975 Wojcik .................................. 355/43
4,165,149 8/1979 Suzuki et al. ........................ 350/6.1
4,251,160 2/1981 Bouwhuis et al. .................. 365/401
4,647,144 3/1987 Finkel ................................... 350/6.5

FOREIGN PATENT DOCUMENTS 3305014 9/1983 Fed. Rep. of Germany .

Primary Examiner—Edward P. Westin
Assistant Examiner—Charles Wieland
Attorney, Agent, or Firm—Foley & Lardner, Schwartz, Jeffery, Schwaab, Mack, Blumenthal & Evans

[57] ABSTRACT

In a method and an arrangement for aligning, examining and/or measuring two-dimensional objects situated on a table of a measuring machine, which table is displaceable at least in two coordinate directions extending perpendicular to one another, light fluxes which are distinguishable according to the associated coordinate direction and which are combined in a beam path and which are imaged in a common intermediate image plane and which are deflected by an optical element according to the coordinate directions associated with them are projected by an imaging system onto the object to be measured in each instance. For the illumination of the respective object structures, an illuminating beam is generated for each coordinate direction, and the object structures illuminated by means of this beam are imaged, separately according to coordinate directions, on scanning means. Furthermore, the object structure images are displaced in both coordinate directions, and the light fluxes resulting from the scanning are converted into electrical signals. These signals serve for the purpose of display, control and/or regulation.

18 Claims, 2 Drawing Sheets

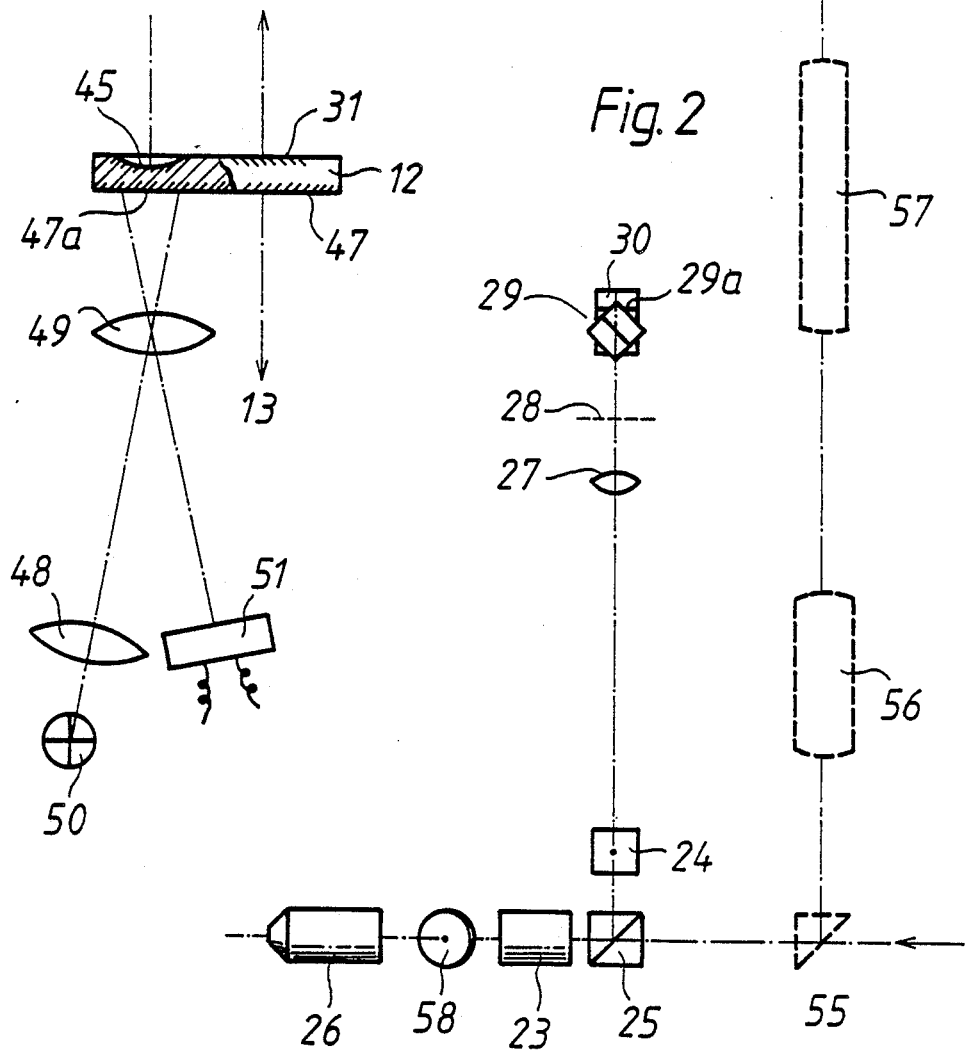

METHOD AND ARRANGEMENT FOR ALIGNING, EXAMINING AND/OR MEASURING TWO-DIMENSIONAL OBJECTS

The invention relates to a method and an arrangement for aligning, examining and/or measuring two-dimensional objects situated on a table of a measuring machine, which table is displaceable at least on two coordinate directions extending perpendicular to one another.

By means of methods and arrangements of this type, structures of masks or wafers are, for example, recorded, aligned, examined and/or measured.

In this connection, from patent application No. P 35 12 615.9 an arrangement is known, in which, in order to determine the position of the objects in terms of coordinates by scanning by means of a light spot, the light fluxes generated from an illuminating device in each coordinate direction are combined in a beam path and imaged by a beam-collecting system in a common intermediate image plane. Moreover, they are deflected by an optical element according to the coordinate directions assigned to them, and are projected by an imaging system onto the objects to be measured in each instance. The light fluxes reflected by the respective object are converted, by at least one photoelectric detector system, into electrical measurement signals, from which the quantities corresponding to the objects are determined in a computer, as a function of the deflection of the light spot and of the position of the table of the measuring machine.

The disadvantage of the described device is that the measurement in the individual coordinate directions can take place only in succession, and that, as a consequence of the light diffraction occurring in the case of the imaging of the very slender light spots, the position of the edges of the object can be determined only with limited accuracy.

In order to overcome these disadvantages, the object of the invention is accordingly to provide a method and an arrangement with which a simultaneous measurement can take place in both coordinate directions, the scanning accuracy is not detrimentally influenced by the imaging of very small light spots, and moreover a low thermal stressing of the object is assured.

The subject of the invention is a method of the initially mentioned type, in which light fluxes which are distinguishable according to associated coordinate directions are combined in a beam path, imaged in a common intermediate image plane and deflected by an optical element according to their coordinate directions, and are projected by an imaging system onto the object to be measured in each instance, and which is defined
 (a) by generation of a light beam for each coordinate direction, for the illumination of the respective object structures,
 (b) by imaging of the object structures illuminated by means of these beams, separated according to coordinate directions, on scanning means,
 (c) by displacement of the light beams and of the object structure images in both coordinate directions,
 (d) by conversion of the respective light fluxes resulting from the scanning of the object structure images by means of the scanning means into electrical measurement signals and
 (e) by evaluation of these signals for the purpose of the measurement value recording, display, control and/or regulation.

The arrangement according to the invention for carrying out the method is defined by
 (a) beam-limiting means in the illuminating device for the generation of an illuminating beam for each coordinate direction, which beam is conducted by means of deflecting means over the structures to be scanned,
 (b) at least one beam-splitting optical element, which, inserted between the imaging system and the deflecting means, causes imaging of the illuminated object structures which is separated according to coordinates,
 (c) an optical component, which is variable in its position, for the displacement of the image of the illuminated object structures in the two coordinate directions and by
 (d) scanning means which comprise at least one photoelectric detector system for each coordinate direction and which converted light fluxes resulting from the scanning of the object structure images into electrical measurement signals.

Advantageous further developments of the method according to the invention and of the arrangement for carrying out the same are the subject of the subclaims.

The invention is schematically represented in an exemplary embodiment in the drawing and is described in greater detail below. In the drawing:

FIG. 1 shows a constructional diaqram of the arrangement according to the invention, FIG. 2 shows a section through the arrangement along the line II—II in side elevation and FIG. 3 shows a section through the arrangement according to the invention, along the line III—III.

In FIG. 1, an illumination slit is illuminated by the illumination energy—supplied by light guides (1) 2—of a light source (not shown) via lenses (3) 4, a divider prism 5 and a collecting optical system 6. The length of the slit can be adapted to the object structures to be investigated, by means of a slit-length limiting device, which is not described here in greater detail, since it does not form part of the invention.

A tubular optical system consisting of lenses 8, 9 and a deflecting prism 10 images the illumination slit 7 in an intermediate image plane 11 common to the light fluxes. On the path thereto, the light fluxes are conducted via an oscillating mirror 12 pivotable in the direction of the double arrow A and passed through a polarizing double-image prism 13.

The double-image prism 13 is composed of a divider cube 14 with a divider coating 15 acting as polarizer and roof prisms 18, 19 situated at adjacent surfaces 16, 17. Of the roof prisms, the roof prism 19 is disposed so as to be rotated through 45° relative to the roof prism 18. Furthermore, respective phase plates 20 and 21 are inserted between the surfaces 16, 17 of the divider cube 14 and the roof prisms 18, 19, so that the direction of polarization of the light reflected at the roof prisms 18, 19 is rotated through 90o and the light flux can emerge in the direction of the intermediate image plane 11 and on pivoting of the oscillating mirror 12 one image moves in the y coordinate direction and the other in the y coordinate direction.

After passing through the double-image prism 13, the two slit images are projected via tube lenses 22 and 23 (FIG. 2), divider prism 24 and deflecting prism 25, as well as an imaging system 26 (FIG. 2), into the object plane, where they illuminate object structures which are also not shown here.

In order to determine the position and size of the object structures illuminated in the manner of a slit, these are imaged by the imaging system 26 via the tube lens 23, the deflecting prism 25, the divider prism 24 and a field lens 27 initially in an intermediate image plane 28. From there, it is taken over by a double-image prism 29, the construction of which is the same as that of the double-image prism 13 with the exception that, in the case of the double-image prism 29, a plane mirror 30 takes the place of the roof prism 18.

Subsequently, the light flux carrying the information concerning the object structures passes to the rear surface 31 of the oscillating mirror 12, which rear surface deflects it and conducts it to a tubular optical system consisting of lenses 32, 33 with an interposed deflecting prism 34.

This tubular optical system images the intermediate image plane 28 with the illuminated object structures, after passing through a divider prism 35 as analyzer, onto the slit stops 37, 38. In this arrangement, the divider surface of the prism 35 conducts the light fluxes polarized by the double-image prisms 13, 29, separately according to the coordinate directions x and y, to the associated slit stops 37, 58.

In conjunction with field lenses 39, 40, the tubular optical system 32-34 images the image—situated in the plane of the mirror rear surface 31—of the exit pupil of the imaging system 26 on a respective photoelectric detector system which is not shown here or, in order to avoid interfering temperature effects on the measuring device, on a respective light guide 41 or 42. These are then associated with respective ones of the photoelectric detector systems, which are not shown here and which are mounted outside of the scanning arrangement.

In order to scan the object structure images, the oscillating mirror 12 is pivoted. As a result of this, it is achieved that, separately according to coordinate directions, the images are conducted via the slit stops 37, 38. The light fluxes resulting therefrom are, as described above, conducted to the light guides 41 and 42, which further conduct them to the photoelectric detector systems mounted outside of the arrangement. In dependence upon the mirror position, these record the edge function and generate therefrom electrical signals, which serve for the determination of the object structure dimensions, and for the control and/or regulation of the displaceable table of the measuring machine.

As a result of the fact that, in the course of its pivoting movement, the oscillating mirror 12 synchronously deflects the illumination beam path (by its front surface) and the measurement beam path (by the rear surface), it is assured that, in all cases, only the object structures illuminated by the slit stop 7 are conducted via the slit stops 37, 38. In order to avoid non-uniform illumination as a consequence of diffraction at the illumination slit 7 in the scanning range of the slit stops 37 and 38, the illumination slit 7 can be designed to be wider than the width of the slit stops 37 and 38.

A generator system 43 known per se is disposed to record the movement of the oscillating mirror 12. This generator system 45 contains an objective 44, which is constructed on the basis of the reflecting-in system and which consists of a concave mirror 45 and a lens 46. The concave mirror 45 is firmly connected to the oscillating mirror 12. In order to determine the respective position of the oscillating mirror, a grating 60 is imaged on a second grating 61, after two-fold passage through the objective 44. The light modulation created in this arrangement is utilized in order to obtain counting pulses, which, when summed, represent a measure of the mirror deflection and thus also a measure of the deflection of the illumination slit images and of the object structure images.

Since, however, the generator system 43 comprises an incremental generator system, on de-energizing the new arrangement the precise position of the "zero" point for the oscillating mirror 12 is lost. However, the position of the "zero" point is important for the further computations, in particular the correction of the distortion of the optical systems employed within the arrangement. Accordingly, it is necessary to generate an electrical pulse, which corresponds to the position of the "zero" point. For this purpose, on the front surface of the oscillating mirror 12 there is provided a separate reflecting surface 47a, which is illuminated with light from a light-emitting diode 50 via a lens 48 and a collimator lens 49.. The reflected light falls on a differential diode 51, which is disposed in the plane of the lens 48 and from which a "zero" pulse can be derived when both diode surfaces are equally strongly illuminated.

For the accurate adjustment of the illumination slit images in relation to the scanning slits, in front of each slit stop 37, 38 there are located respective pivotable plane-parallel plates 52 and 53, by means of which a fine regulation is possible.

Fluctuations in the light emerging from the light guides 1 and 2 are recorded by at least one photoelectric detector system 54, which is set behind the divider cube 5 and the output signals of which, in the event of variation of the intensity of illumination, can be employed for the correction of the edge functions.

If, even on a selective basis, scanning is to take place only in one coordinate direction, the divider cube 5 is to be constructed to be polarizing, and the light for the two coordinate directions is to be supplied through two light guides 1, 2 associated with the coordinate direction.

It is moreover provided that the image generated by the imaging system 26 can be supplied to a TV camera or to a CCD camera. For this purpose, the deflecting prism 25 is equipped with a divider coating, which reflects out both the object structure images and also the images of the illumination slits and supplies them via a right-angled prism 55, for example, to a variable-focus optical system 56, 57 of such a camera, which variablefocus optical system is shown in broken lines.

As is shown in broken lines in FIG. 2, between the imaging system 26 and the tube lens 23 there can also be provided a further divider mirror 58, which serves for the reflecting-in of a reflected light illumination for the TV camera and/or a laser autofocus device.

The advantage of the novel arrangement resides in the fact that as a result of the application of the douhleimage prisms 13, 29 and of the divider cube 5 with polarizing properties, together with a deflecting element 12, scanning can take place simultaneously in both coordinate directions under conditions of low thermal stress.

Furthermore, the light diffraction occurring in the case of the imaging of a narrow slit on the object has no interfering effect on the edge scanning.

A further advantage of the novel arrangement is that, just like the device described in Patent Application No.

P 35 12 615.9, it is suitable for the recording of the position of surfaces, since after two-fold reflection at the plane surface of the mirror to be examined and reflection in a concave mirror there is an oppositely directed movement between the illumination slit image and the slit plane, related to the object plane, so that the edge function can be recorded and the accurate position of the mirror surface can be determined from the two edges of the illumination slit image.

Furthermore, the novel device, as described in No. P 35 12 615.9, can also be employed for the determination of the flatness of the mirrors utilized in the device, in their condition incorporated in the system.

I claim:

1. An apparatus for aligning, examining and measuring two-dimensional objects situated on a table of a measuring machine, said table being displaceable in at least two coordinate directions extending perpendicular to one another, said apparatus comprising:
   a. illumination means for generating an illumination beam, said illumination beam comprising at least two light fluxes distinguished in accordance with an associated coordinate direction and said illumination means including means for combining said light fluxes in a common beam path;
   b. first imaging means for imaging said light fluxes in a common intermediate image plane, said imaging means comprising an optical deflection means, including at least one optical component variable in position, for deflecting said light fluxes in their associated coordinate directions;
   c. position means for determining the position of said optical component of said optical deflection means;
   d. an imaging system for imaging said light fluxes deflected by said deflection means on an object structure and forming illuminated object structure images corresponding to each coordinate direction; and
   e. second imaging means for imaging said illuminated object structure images on a scanner, said second imaging means including said optical deflection means which deflects said illuminated object structure images in their respective coordinate directions, and said scanner including a least one photoelectric detector system for each coordinate direction, wherein said scanner converts said illuminated object structure images into electrical measurement signals.

2. An apparatus as claimed in claim 1, wherein said illumination means comprises a light guide for each of the coordinate directions and a prism that combines the output from said light guides.

3. An apparatus as claimed in claim 2, further comprising identification means for providing said light fluxes with respective mutually differing characteristics.

4. An apparatus as claimed in clai 3, wherein said identificaton means comprises at least one polarizer.

5. An apparatus as claimed in claim 4, wherein said identification means further comprises optical elements that vary the state of polarization of light passed through said polarizer.

6. An apparatus as claimed in claim 1, wherein said scanner includes slit stops.

7. An apparatus as claimed in claim 1, wherein said second imaging means includes at least one polarizer disposed between said projecting means and said scanner.

8. An apparatus as claimed in claim 7, wherein said second imaging means further comprises optical elements that vary the state of polarization of light passed through said polarizer.

9. An apparatus as claimed in claim 1, wherein said second imaging means includes a double-image prism disposed between said imaging system and said scanner.

10. An apparatus as claimed in claim 1, wherein a rear surface of said optical component is employed for the displacement of said illuminated object structure images in their respective coordinate directions.

11. An apparatus as claimed in claim 1, further comprising means for recording the respective angular position of said optical component.

12. An apparatus as claimed in claim 11, wherein said recording means includes an objective, which is constructed on the basis of a reflecting-in system, and a step generator system.

13. An apparatus as claimed in claim 1, wherein said position means comprises a generator for the generation of a zero pulse.

14. An apparatus as claimed in claim 13, wherein said generator includes a collimator system.

15. An apparatus as claimed in claim 1, further comprising means for determining fluctuations in said illumination beam generated by said illumination means.

16. A method for determining characteristics of a two-dimensional object situated on a table of a measuring machine, said table being displaceable in at least two coordinate directions extending perpendicular to one another, in which light fluxes distinguishable according to the associated coordinate direction are combined in a beam path, imaged in a common intermediate image plane, deflected by an optical element connected to a photoelectric generator system in accordance with the coordinate directions associated with them, and are projected by an imaging system onto the object to be measured in each instance, said method comprising the steps of:
   (a) generating an illuminating beam for each coordinate direction and displacing each illuminating beam in its respective coordinate direction with a displacement element,
   (b) separately imaging object structures illuminated by means of the illuminating beams according to coordinate directions on a scanner, said step of separately imaging object structures including displacing object structure images in the coordinate directions with the displacement element,
   (c) converting respective light fluxes of the object structure images by means of the scanner into electrical measurement signals,
   (d) recording spatial data of the photoelectric generator system which defines the position of the displacement element,
   (e) evaluating the electrical measurement signals and the spatial data to determine the characteristics of the object structures.

17. The method as claimed in claim 16, wherein the illumination beams for each coordinate direction receive differing characteristics.

18. The method as claimed in claim 16, wherein the light fluxes for each coordinate direction which proceed from the object structures are differently identified.

* * * * *